United States Patent
Mazumdar et al.

(10) Patent No.: US 12,055,991 B2
(45) Date of Patent: Aug. 6, 2024

(54) FAST DROOP DETECTION CIRCUIT

(71) Applicants: Advanced Micro Devices, Inc., Santa Clara, CA (US); ATI Technologies ULC, Markham (CA)

(72) Inventors: Kaushik Mazumdar, Waltham, MA (US); Miguel Rodriguez, Golden, CO (US); Mikhail Rodionov, Richmond Hill (CA); Stephen Victor Kosonocky, Fort Collins, CO (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 145 days.

(21) Appl. No.: 17/559,111

(22) Filed: Dec. 22, 2021

(65) Prior Publication Data

US 2023/0195191 A1 Jun. 22, 2023

(51) Int. Cl.
*H03K 19/20* (2006.01)
*G06F 1/28* (2006.01)
*H03K 3/037* (2006.01)
*H03K 5/24* (2006.01)

(52) U.S. Cl.
CPC ............... *G06F 1/28* (2013.01); *H03K 3/037* (2013.01); *H03K 5/2472* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,882,238 B2 * | 4/2005 | Kurd | G01K 7/32 331/74 |
| 9,692,396 B2 * | 6/2017 | Yu | H03K 3/011 |
| 10,248,177 B2 * | 4/2019 | Rodriguez | G06F 1/3243 |
| 11,157,028 B1 * | 10/2021 | Lundberg | G05F 1/625 |
| 11,630,161 B1 * | 4/2023 | Rodriguez | H03M 3/30 324/764.01 |
| 2023/0198528 A1 * | 6/2023 | Mazumdar | H03L 7/0805 326/99 |

* cited by examiner

*Primary Examiner* — Jermele M Hollington
(74) *Attorney, Agent, or Firm* — Polansky & Associates, P.L.L.C.; Paul J. Polansky; Nathan H. Calvert

(57) ABSTRACT

A power supply monitor includes a droop detection circuit which receives a digital signal and converts the digital signal to an analog signal, compares the analog signal to a monitored supply voltage, and responsive to detecting a droop below a designated value relative to the analog signal, produces a droop detection signal. The droop detection circuit includes a first comparator circuit with a series of inverters including at least a first complimentary-metal-oxide-semiconductor (CMOS) inverter with an input for receiving the analog signal and a second CMOS inverter, which are both supplied with a monitored supply voltage. The inverters operate in a crowbar mode when the monitored voltage supply is near a designated level, and each include four pull-up transistors connected in two parallel legs of two transistors, and four pull-down transistors connected in two parallel legs of two transistors.

22 Claims, 11 Drawing Sheets

FAST DROOP DETECTION CIRCUIT

BACKGROUND

Integrated circuits and discrete circuits include terminals for receiving power from a power supply to provide a source voltage for the associated circuitry. A circuit, for example an inverter, is often connected between the supply and circuit common or ground. In the case of metal-oxide semiconductor field-effect transistors (MOSFETs), a specified voltage at a gate terminal activates the transistor to create a circuit path to drive circuit elements connected between an output terminal and the supply or ground and to drive the operation of subsequent circuits connected to the output terminal. Typically, the amount of current and circuit loading is related to both the operation speed and power supply voltage. Because of the active nature of many circuits, the loading will sometimes vary and, at times, may cause a supply voltage level to drop or be lowered from the desired level.

Voltage droop is a term used to refer to the drop in voltage from the desired voltage level as the supply drives a load. In a regulated system, the output voltage can sag when a load is suddenly increased very rapidly. For example, a transient loading condition may occur causing a voltage droop. If the droop is too large, then circuit failure results.

In prior art systems, supply adjustment circuits, or "header" circuits, are operably disposed between a supply and a circuit and are regulated to adjust or compensate for such variations in the supply. For example, some solutions include header circuits that constantly switch at a relatively high frequency relative to other power management features such as power state changes, in order to minimize the loading from the transient response and to regulate the supply voltage. These header circuits are often optimized to respond very quickly to voltage droops due to transient loading conditions and other loading conditions.

These prior art systems typically have substantial customized analog design blocks and add significant overhead as they switch in and out of connecting relatively large field effect transistors in order to respond to transient loading conditions. This overhead even occurs when operating in a steady-state mode. Thus, such systems not only consume precious integrated circuit real estate, but also are inefficient from a power perspective.

Figure 1:
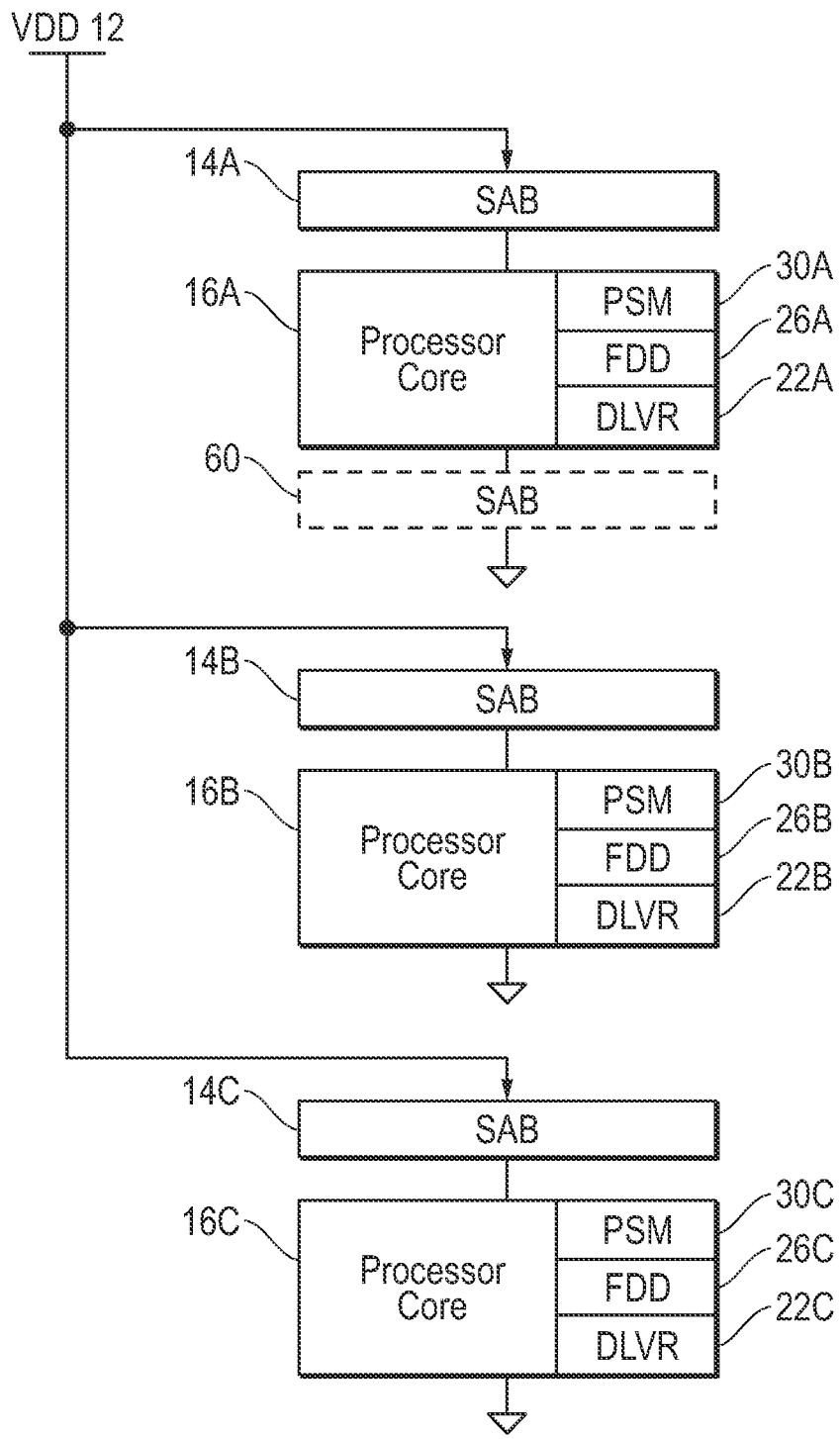
FIG. 1 illustrates, in block diagram form, a system for regulating supply voltages to a plurality of processor cores according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A processor includes a droop detection circuit which receives a digital signal and converts the digital signal to an analog signal, compares the analog signal to a monitored supply voltage, and responsive to detecting a droop below a designated value relative to the analog signal, produces a droop detection signal. The droop detection circuit includes a first comparator circuit with a series of inverters including at least a first complimentary-metal-oxide-semiconductor (CMOS) inverter with an input for receiving the analog signal and a second CMOS inverter, each with a positive supply terminal for receiving the monitored voltage supply, each configured to operate in a crowbar mode when the monitored voltage supply is near a designated level, each comprising four pull-up transistors connected in two parallel legs of two transistors, and four pull-down transistors connected in two parallel legs of two transistors.

A data processing system includes an integrated circuit including at least two processor tiles each comprising digital logic, a local clock providing a clock signal for synchronizing the digital logic, and a local power supply monitor for monitoring a respective monitored local supply voltage. At least one of the local power supply monitors includes a reference signal generator and a droop detection circuit. The reference signal generator receives a digital value and produces a pulse-density modulated signal based on the digital value. The droop detection circuit converts the pulse-density modulated signal to an analog signal, compares it to the respective monitored local supply voltage, and responsive to detecting a droop below a designated value relative to the analog signal, produces a droop detection signal, the droop detection circuit including a first comparator circuit with a series of inverters including at least a first complimentary-metal-oxide-semiconductor (CMOS) inverter with an input for receiving the analog signal and a second CMOS inverter, each with a positive supply terminal for receiving the respective monitored local voltage supply, each configured to operate in a crowbar mode when the respective monitored local voltage supply is near a designated level, each comprising four pull-up transistors connected in two parallel legs of two transistors, and four pull-down transistors connected in two parallel legs of two transistors.

A method of monitors a power supply. The method includes receiving a binary number, and creating a pulse-density modulated signal referenced to a first supply voltage and scaled based on the binary number. This pulse-density modulated signal is lowpass filtered to create an analog signal. With a series of inverters, the method detects a droop in a monitored supply voltage by comparing the analog signal to a portion of the monitored supply voltage by supplying the monitored supply voltage to respective power supply terminals of the inverters and feeding the analog signal to a first inverter of said series of inverters. The method includes splitting inverter activation current for at least the first inverter between two parallel legs of two series pull-up transistors and splitting inverter deactivation current for at least the first inverters between two parallel legs of two series pull-down transistors.

FIG. 1 illustrates, in block diagram form, a system for regulating supply voltages to a plurality of processor cores according to the prior art. A supply VDD 12 is connected to a plurality of supply adjustment blocks (SAB) 14A-C. Each of the supply adjustment blocks 14A-C is connected to produce an adjusted supply voltage to a processor core 16 A-C. Each of the processor cores 16 A-C includes a power supply monitor (PSM) 30 A-C, a fast droop detector (FDD) 26 A-C, and a digital low voltage regulator (DLVR) 22 A-C. Each DLVR 22 A-C is formed within the processor core 16 A-C, respectively. The processor cores and their associated circuitry may be referred to as a "processor tile".

In some versions, a supply adjustment block 60 may be used either in addition to or in place of a supply adjustment block 14. As may be seen, supply adjustment block 60 is a footer circuit rather than a header circuit meaning that the supply adjustment block is connected between the processor core and ground instead of being connected between the processor core and the supply. In versions where a supply of adjustment block 60 is included, the specific discrete logic is modified to support the desired operations and one of average skill in the art may readily make such transformations in design. The first and second regulators would remain the same. Thus, for example, a charge inject signal generated by FDD 26 A-C would serve to activate or select resistive elements within supply adjustment block 60. While only one supply adjustment block 60 is shown in dashed lines, it should be understood that a plurality of supply adjustment blocks 60 could be included in the version of FIG. 1. As with a supply adjustment block 14 comprising a header circuit, a second regulator, namely FDD 26 A-C, generates a charge inject signal that causes selected resistive elements to be activated to adjust the voltage drop across the supply adjustment block 14 A-C and therefore to adjust voltage produced to the processor core 16 A-C.

Figure 2:
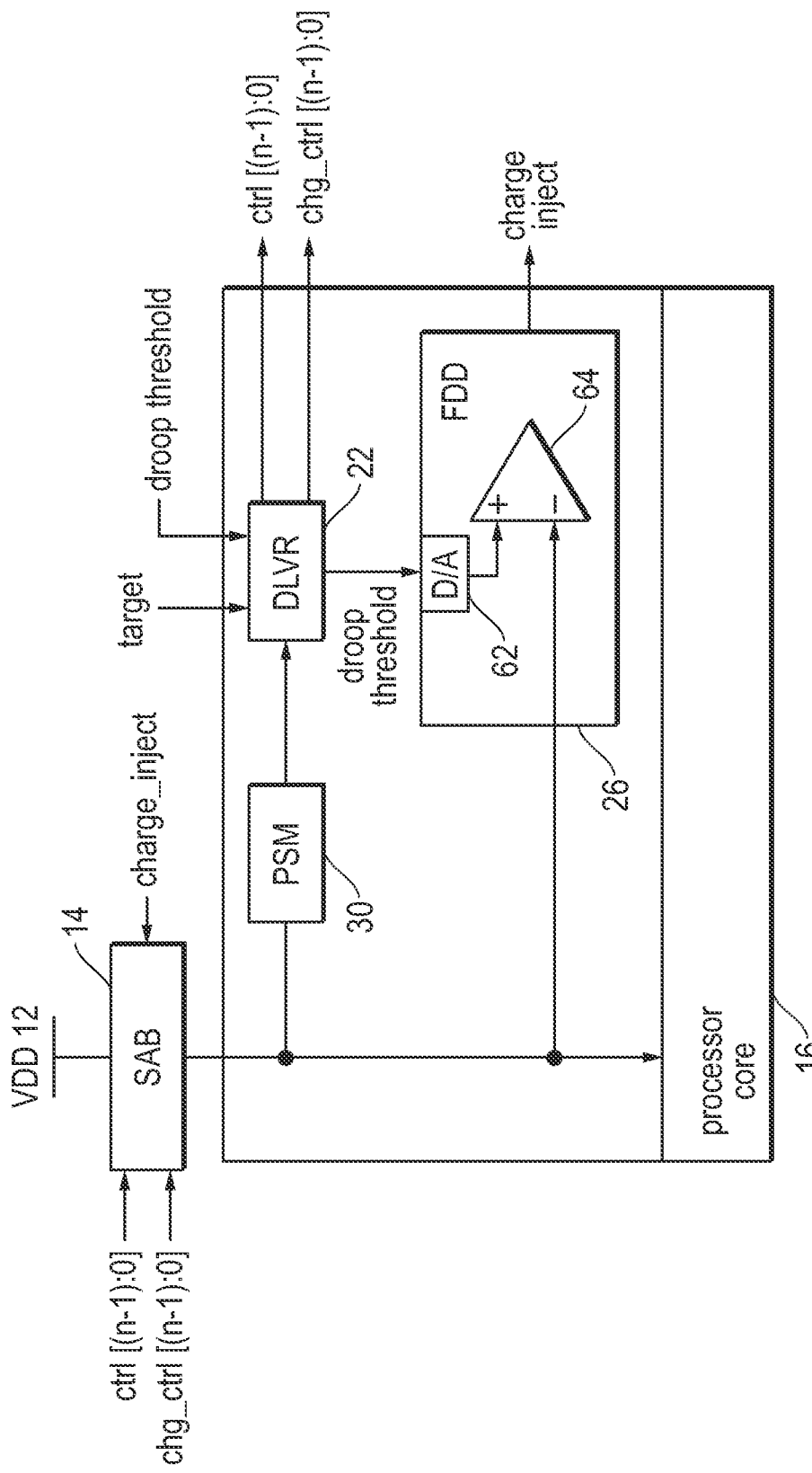
FIG. 2 illustrates, partially in block diagram form and partially in schematic form, further details of a regulator system that compensates for droop according to the prior art.

FIG. 2 illustrates, partially in block diagram form and partially in schematic form, further details of a regulator system that compensates for droop according to one embodiment of the invention. A supply voltage VDD 12 is connected to supply adjustment block 14 that in turn produces the adjusted supply voltage to processor core 16. The magnitude of the adjusted supply voltage is based upon the values of a control word, a charge control word and the charge inject signal generated by FDD 26. In the described version, PSM 30, DLVR 22 (the first regulator), and FDD 26 (the second regulator) are all formed within processor core block 16 in the version of FIG. 2.

The adjusted supply voltage is produced to PSM 30 that in turn produces the digital representation of the adjusted supply voltage magnitude to DLVR 22. The adjusted supply voltage is also produced to FDD 26. DLVR 22 is further connected to receive the target adjusted supply voltage, shown as target ADJ VDD, and the droop threshold level from an external source. The external source may be a power management block in one embodiment. DLVR 22 produces the droop threshold level to FDD 26. DLVR 22 also produces the control word "ctrl [(n−1):0]" and the charge control word "chg_ctrl [(n−1):0]" to supply adjustment block 14.

FDD 26 includes a digital-to-analog converter (DAC) 62 that is connected to receive the droop threshold level from DLVR 22 and is configured to produce an analog signal whose magnitude corresponds to the received droop threshold level to a plus (+) input of a comparator 64. In the depicted version, DAC 62 is a sigma-delta converter. A minus (−) of comparator 64 is connected to receive the adjusted supply voltage produced by supply adjustment block 14. Comparator 64 generates the charge inject signal that activates the supply adjustment block whenever the adjusted supply voltage falls below the analog droop threshold level or voltage. It should be noted, in the charge selection block utilizes NAND logic, a logic one for the charge injection signal triggers the charge injection or, more specifically, supply voltage adjustment for a selected MOSFET. A logic zero is only generated when the droop threshold is lower than the adjusted supply voltage. It should also be noted that the version of FIG. 2 includes a first regulator (DLVR 22) formed within processor core block 16. In an alternative version, the first regulator, namely DLVR 22, may be formed outside of processor core 16.

FDD 26 performs its processing very quickly by performing an analog comparison of the adjusted supply voltage and the droop threshold. Accordingly, the charge injection signal may be generated nearly instantly and may be generated much more quickly than processor-based digital logic that requires a number of clock cycles to obtain all necessary data and to process the data. As such, the second control loop that includes FDD 26 is a fast-acting control loop to immediately correct or regulate the adjusted supply voltage whenever the adjusted supply voltage falls below the droop threshold level. The first regulation loop, in contrast, that includes the first regulator (DLVR 22), is a slower acting loop that compares the adjusted supply voltage to a target adjusted supply voltage value. By utilizing a fast acting second control loop with FDD 26, a simpler and slower first regulation loop may be utilized to reduce IC real estate and associated power consumption. Moreover, because the decision-making in the second control loop is made in analog (real time), the first control loop may be clocked at a lower rate thereby saving power.

Figure 3:
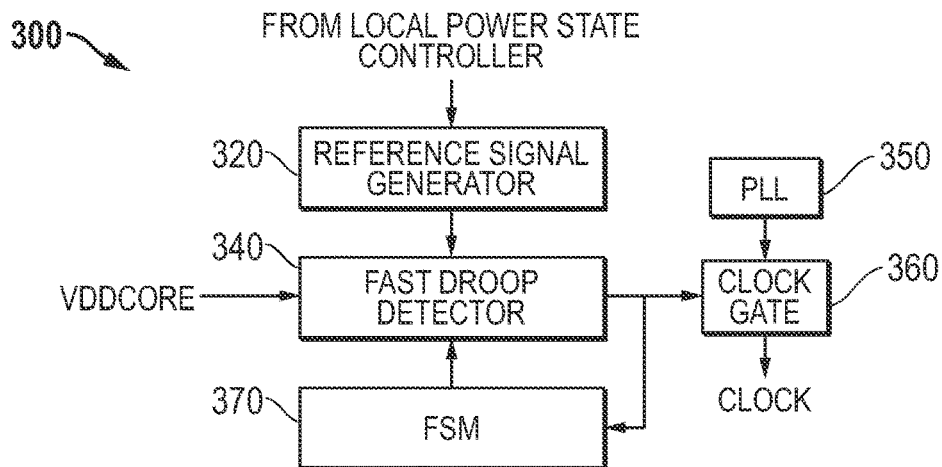
FIG. 3 illustrates in block diagram form a power supply monitor according to some embodiments.

FIG. 3 illustrates in block diagram form a power supply monitor 300 according to some embodiments. Power supply monitor 300 includes a reference signal generator 320, a fast droop detector 340, phase-locked loop (PLL) 350, a clock gate 360, and a finite state machine 370.

Reference signal generator 320 has an input connected to a local power controller and receiving a digital number indicating a reference voltage, and an output providing a modulated digital signal indicating the reference voltage. The reference voltage is associated with the desired level of a local supply voltage "VDDCORE" to be monitored. Fast droop detector 340 has a first input connected to the output of reference signal generator 320, a second input receiving the VDDCORE supply voltage, a third input, and an output.

PLL 350 has a number of control and enable inputs (not shown) and an output providing a clock signal. Clock gate 360 has an input receiving the clock signal from PLL 350, an input connected to the output of fast droop detector 340, and an output for providing a gated or ungated clock signal for synchronizing circuitry within a domain of the monitored supply voltage.

FSM 370 has an input connected to the output of fast droop detector 340, and an output connected to the second input of fast droop detector 340, and may include a number of other control inputs (not shown). FSM 370 may include a counter to employ in determining when to reset the clock gate control signal.

In operation, the local power controller for the voltage domain of the monitored supply voltage is operable to adjust the monitored supply voltage and provide a new value for the binary number to the reference signal generator corresponding to the adjusted monitored supply voltage. Reference signal generator 320 provides a digitally modulated signal, such as a pulse-density modulated signal, carrying the provided value. Fast droop detector 340 compares the VDDCORE supply voltage to an analog signal based on the digitally modulated signal to detect droops in the VDDCORE supply voltage. Based on detecting such a droop, fast droop detector 340 controls clock gate 360 to gate the clock signal for a designated period to reduce the power consumed by the circuit and mitigate the drooping voltage on the VDDCORE supply. FSM 370 controls the designated period by resetting the clock gate control signal a, such as by controlling a latch.

Figure 4:
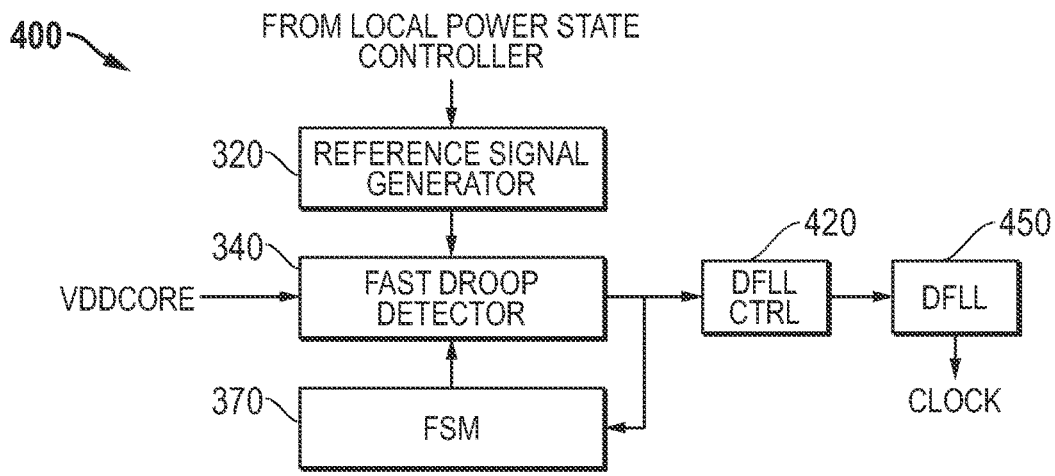
FIG. 4 illustrates a block diagram of a power supply monitor according to some additional embodiments.

FIG. 4 illustrates a block diagram of a power supply monitor 400 according to some additional embodiments. Power supply monitor 400 includes a reference signal generator 320, a fast droop detector 340, a digital frequency-locked loop (DFLL) 450, a DFLL control circuit 420, and a finite state machine 370. In this embodiment, the droop detection performed by fast droop detector 340 is used to control DFLL 450 to increase or decrease its output clock signal frequency.

Reference signal generator 320 has an input connected to a local power controller and receiving a digital number indicating a reference voltage, and an output providing a modulated digital signal indicating the reference voltage. The reference voltage is associated with the desired level of local supply voltage "VDDCORE" to be monitored. Fast droop detector 340 has an input connected to the output of reference signal generator 320, an input receiving the VDDCORE supply voltage, a second input, and an output.

DFLL 450 has a number of control and enable inputs (not shown) and an output providing a clock signal for synchronizing circuitry within a domain of the monitored supply voltage. DFLL control circuit 420 has an input connected to the output of fast droop detector 340, and an output connected to DFLL 450.

FSM 370 has an input connected to the output of fast droop detector 340, an output connected to the second input of fast droop detector 340, and may include a number of other control inputs (not shown).

In operation, the local power controller for the voltage domain of the monitored supply voltage is operable to adjust the monitored supply voltage and provide a new value for the binary number to reference signal generator 320 corresponding to the adjusted monitored supply voltage. Reference signal generator 320 provides a digitally modulated signal carrying the provided value. Fast droop detector 340 compares the VDDCORE supply voltage to an analog signal based on the digitally modulated signal to detect droops in the VDDCORE supply voltage. Based on detecting such a droop, fast droop detector 340 sends a droop detected signal to DFLL control circuit 420. Based on this signal, DFLL control circuit 420 commands DFLL to slow the clock, or stop and then slow the clock, for a designated period.

Figure 5:
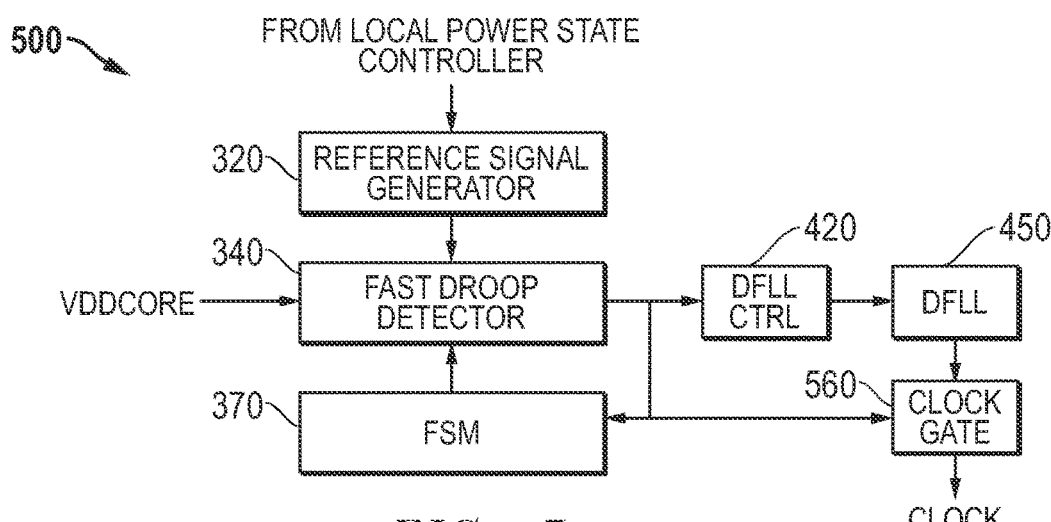
FIG. 5 shows in block diagram form a power supply monitor according to further additional embodiments.

FIG. 5 shows in block diagram form a power supply monitor 500 according to further additional embodiments. Power supply monitor 400 includes a reference signal generator 320, a fast droop detector 340, a digital frequency-locked loop (DFLL) 450, a DFLL control circuit 420, a clock gate 560, and a finite state machine 370. In this embodiment, the DFLL control scheme of FIG. 4 is used together with clock gate 560 in order to provide more rapid response to detected droops.

Reference signal generator 320 has an input connected to a local power controller and receiving a digital number indicating a reference voltage, and an output providing a modulated digital signal indicating the reference voltage. The reference voltage is associated with the desired level of local supply voltage "VDDCORE" to be monitored. Fast droop detector 340 has an input connected to the output of reference signal generator 320, an input receiving the VDDCORE supply voltage, a second input, and an output.

DFLL 450 has a number of control and enable inputs (not shown) and an output providing a clock signal for synchronizing circuitry within a domain of the monitored supply voltage. DFLL control circuit 420 has an input connected to the output of fast droop detector 340, and an output connected to DFLL 450. Clock gate 560 has a first input connected to the output of DFLL 450, a second input connected to the output of fast droop detector 340, and an output for selectively providing the clock signal from DFLL 450.

FSM 370 has an input connected to the output of fast droop detector 340, an output connected to the second input of fast droop detector 340, and may include a number of other control inputs (not shown).

In operation, the local power controller for the voltage domain of the monitored supply voltage is operable to adjust the monitored supply voltage and provide a new value for the binary number to the reference signal generator corresponding to the adjusted monitored supply voltage. Reference signal generator 320 provides a digitally modulated signal carrying the provided value. Fast droop detector 340 compares the VDDCORE supply voltage to an analog signal based on the digitally modulated signal to detect droops in the VDDCORE supply voltage. Based on detecting such a droop, fast droop detector 340, sends a droop detected signal to clock gate 560 and DFLL control circuit 420. Based on this signal, clock gate 560 gates the clock to immediately gate the clock while DFLL control circuit 420 commands DFLL 450 to slow the clock for a designated period. Because DFLL 450 is relatively slow in responding to commands to implement a change in clock frequency, fast droop detector 340 is also responsive to the droop detection signal to control clock gate 560 to gate the clock signal for a designated period to reduce the power consumed by the circuit and mitigate the drooping voltage on the VDDCORE supply. FSM 370 controls the designated period by resetting the clock gate control signal, such as by controlling a latch.

Figure 6:
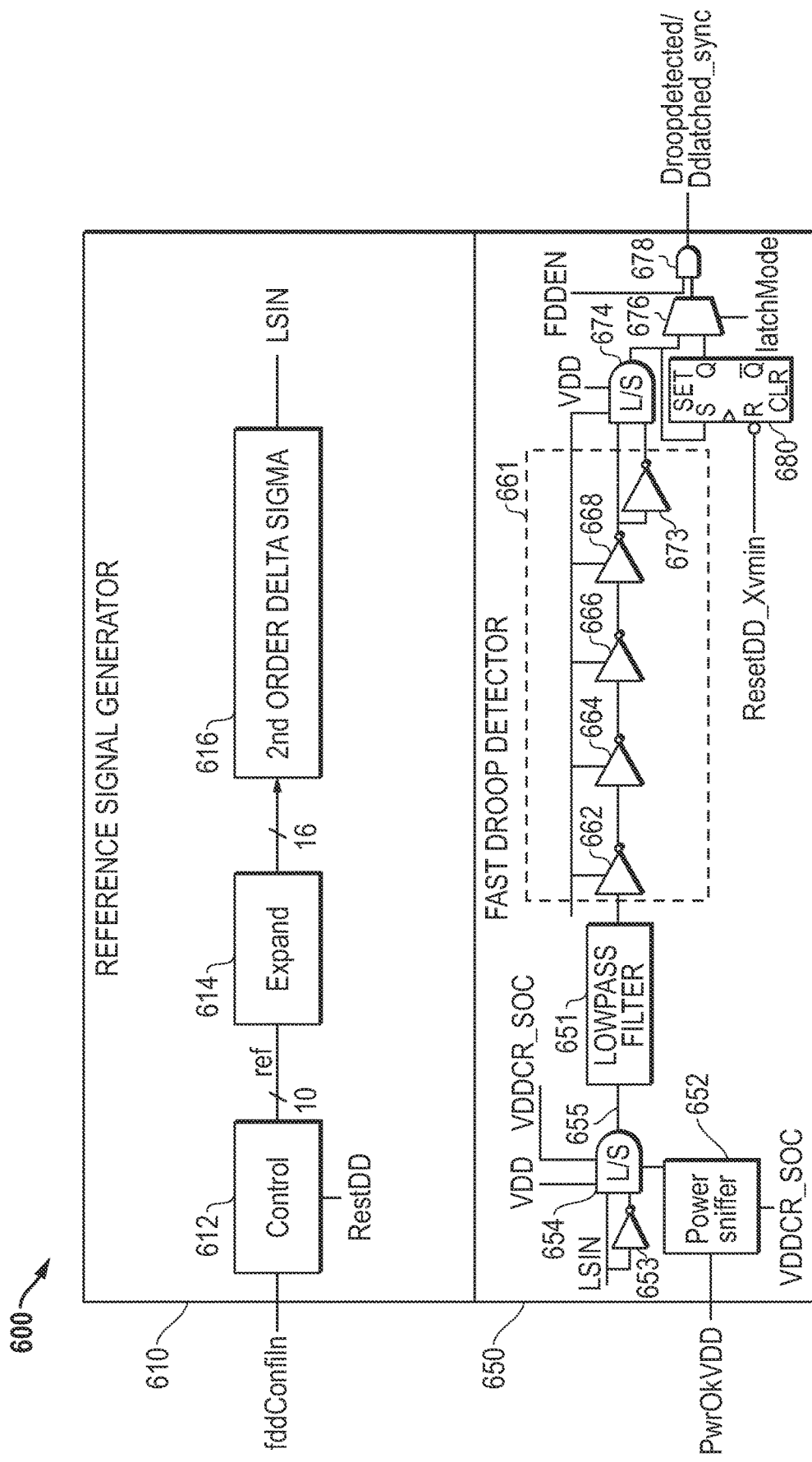
FIG. 6 shows in mixed block diagram and circuit diagram form a portion of a power supply monitor according to further additional embodiments.

FIG. 6 shows in mixed block diagram and circuit diagram form a portion of a power supply monitor 600 according to further additional embodiments. The depicted portion of a power supply monitor 600 is suitable for use with the monitoring and control topologies shown in FIG. 3, FIG. 4, and FIG. 5, as well as other circuits in which a power supply is monitored to detect fast droops of the power supply voltage. For example, the design of power supply monitor 600 is employed in some embodiments to control a charge injection system such as the prior art system shown in FIG. 1 and FIG. 2. Power supply monitor 600 generally includes a reference signal generator 610 and a fast droop detector circuit 650.

In this embodiment, reference signal generator 610 has input labeled "fddConfigIn" receiving a binary number and an output labeled "LSIN" providing a pulse-density modulated signal. Generally, reference signal generator 610 operates to scale the pulse-density modulated signal based on the binary number. Reference signal generator 610 includes a control circuit 612, an expander 614, and a second order delta sigma modulator 616. Control circuit 612 has a first input receiving a 10-bit binary number carried on the fddConfigIn input, and an output labelled "ref" carrying the 10-bit binary number. Control circuit 612 generally operates to halt the passage of the 10-bit binary number when the resetDD signal indicates fast droop detector circuit 650 is disabled or reset and also operates to pass the 10-bit binary number to the its output when the fast droop detector is operational. Expander 614 has an input connected to the output of control circuit 612 and an output. Expander 614 expands the 10-bit number to a 16-bit number.

In this implementation, delta-sigma modulator 616 is a second-order delta-sigma modulator having an input connected to the output of expander 614 and an output providing a pulse-density modulated binary signal LSIN. While delta-sigma modulation is used in this embodiment, other suitable modulation schemes may be employed to provide the pulse density modulated signal based on the binary number; the output LSIN representing a desired voltage level for the monitored power supply.

Reference signal generator 610 generates a bitstream whose average value (ideally) equals a supply voltage VDD on which reference signal generator 610 operates, scaled by the 10-bit binary number received as a reference at the fddConfigIn input. The long-term average output voltage of the bitstream LSIN will correspond to Equation 1 below, with "ref_value" being the value of the 10-bit number supplied the fddConfigIn input:

$$<LSIN>avg=ref\_value*VDD \quad (1)$$

While this particular modulator design is employed in this embodiment, other embodiments employ other suitable delta-sigma modulator designs, or other types of modulators for producing a pulse-density modulated signal. The pulse-density modulated signal LSIN is fed to the input of fast droop detector circuit 650.

Fast droop detector circuit 650 includes a power sniffer 652, a level shifter 654, a lowpass filter 651, a comparator 661, a second level shifter 674, a latch 680, a two-to-one multiplexor 676, and an AND gate 678. Fast droop detector circuit 650 is suitable for use in the power supply monitor circuits of FIG. 3, FIG. 4, and FIG. 5, as well as other power supply monitor circuits.

Level shifter 654 has a first input receiving the pulse-density modulated signal LSIN, a second input receiving an enable signal from power sniffer 652, and an output providing the pulse-density modulated signal referenced to a clean supply voltage labeled "VDDCR_SOC" at the node labelled 655 (the voltage on this node is referred to as "voltage 655"). Level shifter 654 may also include an inverting input 653 to provide an inverter version of signal LSIN for use in level shifting. Level shifter 654 is supplied with two voltages for the two domains across which it shifts voltage levels, from VDD to VDDCR_SOC.

Power sniffer 652 has a first input receiving a power indication signal labeled "PwrOkVDD", a second input receiving the clean supply voltage VDDCR_SOC, and an output connected to level shifter 654. Power sniffer 652 enables level shifter 654 to be responsive to its two inputs when VDD is in a designated range.

Lowpass filter 551 has an input coupled to the output of level shifter 254 and an output. Many lowpass filter designs and component values are suitable for use in various embodiments.

Comparator 661 has a first input coupled to the output of lowpass filter 651, a second input receiving a monitored supply voltage VDDCORE, and an output. Generally, comparator 661 provides a droop detection signal at its output responsive to the monitored supply voltage VDDCORE dropping below a predetermined level relative to the first input. In this embodiment, comparator 661 comprises a series of four inverters including a first complimentary-metal-oxide-semiconductor (CMOS) inverter 662, a second CMOS inverter 664, a third CMOS inverter 666, and a fourth CMOS inverter 668. Each inverter 662, 664, 666, and 668 includes a positive supply terminal connected to the second input of the comparator to provide VDDCORE as the supply voltage for the inverters. CMOS inverter 662 has an input connected to first input of the comparator 661, and inverters 664, 666, and 668 are connected in series following inverter 662. The output of inverter 668 provides a droop detection signal to level shifter 674.

In this embodiment, inverters 662, 664, 666, and 668 are biased such that they are configured to operate in a "crowbar" mode or crowbar region of operation in which both the p-type metal-oxide semiconductor (PMOS) and n-type metal-oxide semiconductor (NMOS) sides of the inverter are turned on when the monitored supply voltage is at approximately the predetermined level relative to the voltage on the respective inverter input. In this embodiment, the predetermined level is twice the level of the voltage at the inverter input. Thus, as one-half of VDDCORE drops to the voltage at the output of lowpass filter 651, inverters 662, 664, 666, and 668 enter crowbar mode and switch from a digital low to a digital high to signal a droop. Such operation provides a high gain and fast response for detecting droops below a designated level relative to the threshold voltage provided at the input of inverter 662. Since the inverters are biased in a crowbar-state, they are highly sensitive to any noise on the input VDD rail. In some embodiments, at least inverter 662, or inverters 662 and 664, are biased in such a crowbar state.

Level shifter 674 has an input connected to the output of comparator 661, and an output. Level shifter 674 is supplied with both the VDDCORE supply voltage (the monitored voltage), and the VDD supply voltage. Level shifter 674 may also include an inverting input 673 to provide an inverter version of the droop comparator output for use in level shifting. Level shifter 674 operates to shift the droop detection signal to be referenced to the VDD voltage.

Multiplexor 676 has a first input connected to the output of level shifter 674 for receiving the droop detection signal, a second input, a selector input labeled "latchMode", and an output coupled to the clock gate (i.e., 360, FIG. 3, 560, FIG. 5) for gating a clock signal responsive to the droop detection signal.

Latch 680 is a set-reset (SR) flip flop having an "S" input connected to the output of level shifter 674, an "R" input receiving a reset signal labeled "resetDD", a "Q" output connected to the second input of multiplexor 676, and a "Q-NOT" output which is unused in this embodiment. The latchMode input of multiplexor 676 is used to select whether the between the two inputs.

AND gate 678 has a first input receiving an enable signal for the droop detection circuit labeled "FDDEN", a second input receiving the droop detection signal from the output of multiplexor 676, and an output providing the final output of fast droop detector circuit 650 labelled "droopDetected".

In operation, fast droop detector circuit 650 receives the LSIN pulse-density modulated signal. Due to the variability on VDD, this signal needs to be translated into a fixed voltage, which is accomplished through level shifter 654 supplied from VDDCR_SOC. This VDDCR_SOC voltage is a stable, regulated voltage providing a fixed amplitude for the level-shifted pulse-density modulated output of level shifter 654. The new, fixed amplitude signal feeds lowpass filter 651, which averages the value of the pulse-density modulated signal to produce a stable analog voltage to use with comparator 661. This stable analog value provides a threshold for detecting droops in the VDDCORE voltage supply. In this embodiment, the threshold ("fdd threshold", FIG. 7) is twice the voltage of the stable analog value. Lowpass filter 651 is a double RC low pass filter operating with a cut-off frequency under 10 MHz.

The output of low pass filter 651 feeds the series of inverters in comparator 661 supplied from VDDCORE that acts as an analog comparator. Because they are biased in the "crowbar" region, the series of inverters responds quickly to droops below the designated threshold. Preferably at least two inverters are used to provide stability for the droop detected signal, and preferably more—perhaps at least three or four (as shown). The droop detected signal at the output of comparator 661 is level shifted back to VDD domain to be used for controlling various circuits to mitigate power supply droop, such as the clock gate and PLL circuits depicted in FIG. 3, FIG. 4, and FIG. 5. Latch 680 is included to hold the droop detected signal at a digital HIGH for a designated period to provide proper timing for control of operations such as a one-time charge injection operation or a PLL adjustment. When latch 680 is enabled, the droop detected signal remains on once is triggered until is actively turned off by the local FSM.

Figure 7:
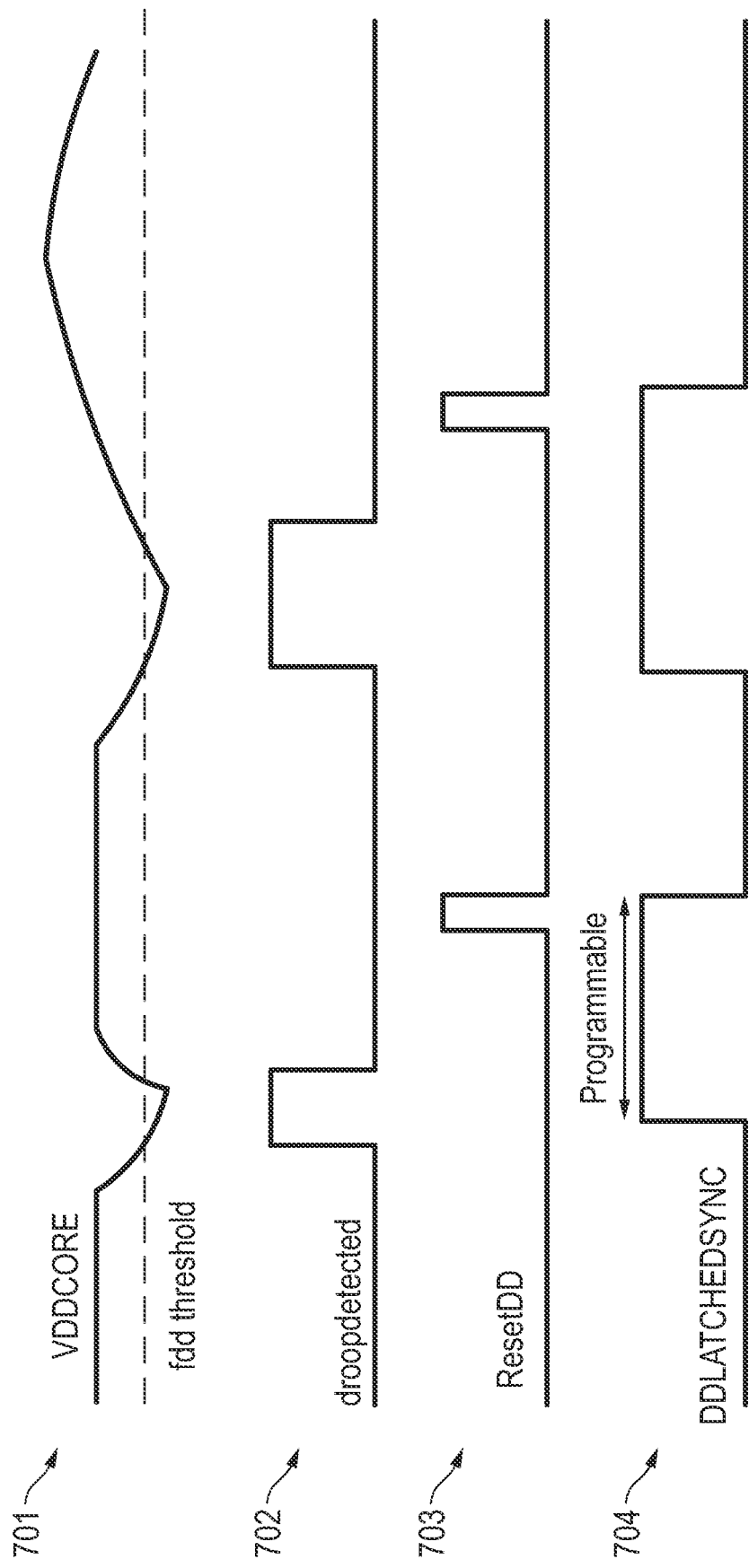
FIG. 7 shows a graph depicting respective signals associated with fast droop detector circuit of FIG. 6 when employed to control a clock gate such as in the arrangement depicted in FIG. 3.

FIG. 7 shows a graph depicting respective signals associated with power supply monitor 600 of FIG. 6 when employed in a circuit to control a clock gate such as the arrangement depicted in FIG. 3. The four depicted signals 701, 702, 703, and 704 are shown with their voltage level on their vertical axis and aligned over time on their horizontal axis. The graph the operation over time as two droops are detected in the monitored supply voltage VDDCORE.

Signal 701 shows monitored supply voltage VDDCORE relative to the fdd threshold on which comparator 661 detects droops. VDDCORE droops below the threshold twice in the signal 701 depicted in the scenario of FIG. 7. Comparator 661 detects the droop and produces the "droopdetected" signal shown in signal 702. An FSM such as FSM 370 (FIG. 3, FIG. 4, FIG. 5), provides the signal "ResetDD". The ResetDD signal 703 controls the operation of latch 680 to reset it after a droop is detected.

Signal 704 shows the latched droop detected signal, "DDLATCHEDYSNC", which is activated goes HIGH when the droop detected signal activates the latch output, and is held HIGH until it is reset by the FSM. The FSM has a programmable period which can be adjusted depending on the use of the DDLATCHEDSYNC signal, for example to gate a clock, adjust a PLL, or signal to a throttling control circuit that a particular circuit needs to be throttled.

Figure 8:
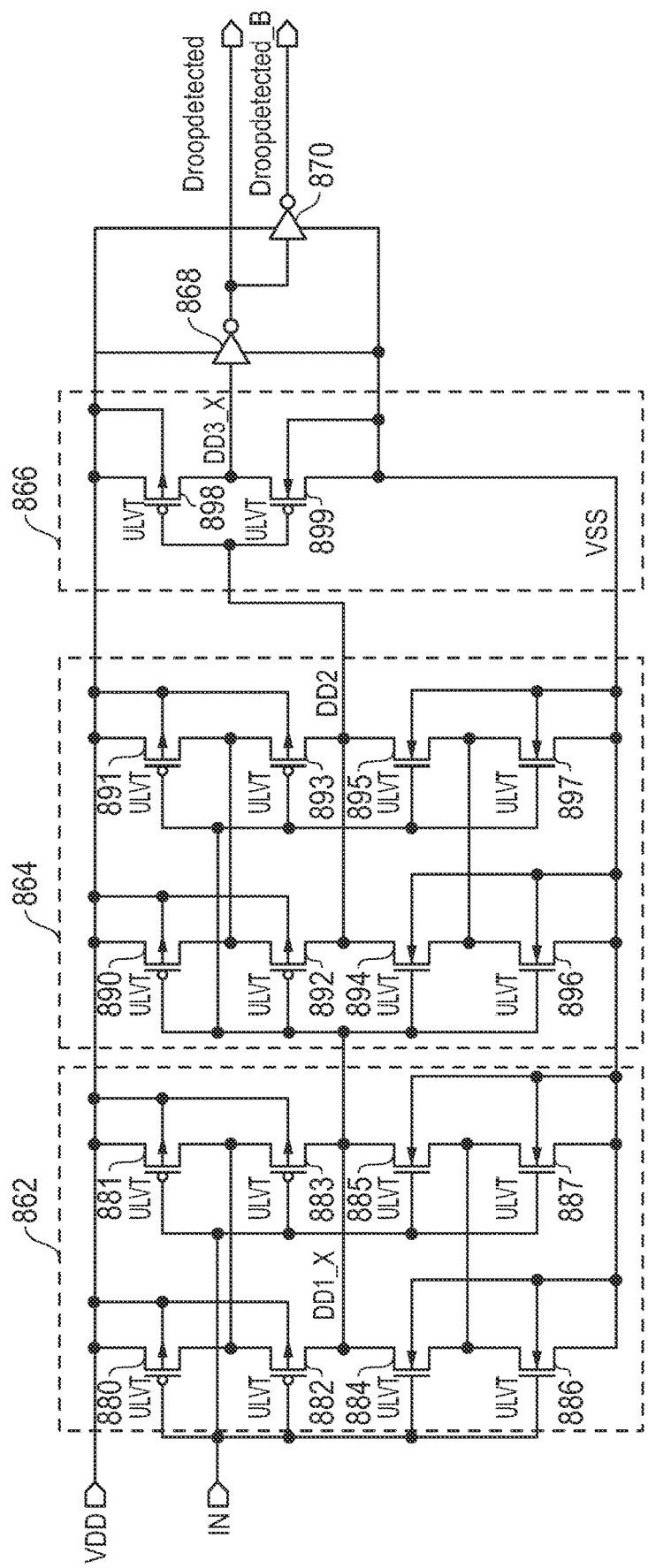
FIG. 8 shows a comparator circuit for use in a fast droop detector according to some embodiments.

FIG. 8 shows a comparator circuit 800 for use in a fast droop detector according to some embodiments. In the depicted implementation, the comparator 661 (FIG. 6) is redesigned for use with small lithography nodes (e.g., 5 nanometer (nm) and smaller) technology nodes to solve aging and long-term heat damage from inverter inrush current. The first and second inverters of the comparator have their transistors replaced with a 2×2 grid of devices to limit both voltage and current through any single device. The device layout is also improved to avoid heat damage and overvoltage. As such, comparator 800 is suitable for use in a fast droop detector circuit such as those depicted in FIG. 3, FIG. 4, FIG. 5, and FIG. 6, as well as other fast droop detector circuits.

Comparator 800 includes a first input receiving an analog voltage labelled "IN" for comparison, a second input receiving a monitored supply voltage "VDD," and an output providing a signal labelled "Droopdetected". Some embodiments also include an inverse output inverter 870 to also provide an inverted output signal labelled "Droopdetected_B". Comparator 800 includes a series of inverters including a first complimentary-metal-oxide-semiconductor (CMOS) inverter 862, a second CMOS inverter 864, a third CMOS inverter 866, and a fourth CMOS inverter 868.

Inverter 862 has an input receiving the analog voltage IN, a positive supply terminal connected to the second comparator input for receiving the supply voltage VDD, and an output. Inverter 862 includes four pull up transistors 880, 881, 882, and 883 connected in two parallel legs of two transistors each, and four pull-down transistors 884, 885, 886, and 887, also connected in two parallel legs of two transistors each. Referring to the pull-up transistors, in this implementation, each pull-up transistors is a p-type metal oxide semiconductor (PMOS) transistor. Transistor 880 has a source receiving the monitored supply voltage VDD, a gate connected to the comparator input, and a drain. Transistor 882 has a source connected to the drain of transistor 880, a gate connected to the comparator input, and a drain connected to the output of inverter 862. Transistor 881 has a source receiving the monitored supply voltage VDD, a gate connected to the comparator input, and a drain. Transistor 883 has a source connected to the drain of transistor 882, a gate connected to the comparator input, and a drain connected to the output of inverter 862. Referring to the pull-down transistors, in this implementation each pull-down transistor is an n-type metal oxide semiconductor (NMOS) transistor. Transistor 884 has a drain connected to the output of inverter 862, a gate connected to the comparator input, and a source. Transistor 886 has a drain connected to the source of transistor 884, a gate connected to the comparator input, and a source connected to a negative supply rail VSS for supply voltage VDD. Similarly, transistor 885 has a drain connected to the output of inverter 862, a gate connected to the comparator input, and a source. Transistor 887 has a drain connected to the source of transistor 885, a gate connected to the comparator input, and a source connected to negative supply rail VSS.

Inverter 864 includes four pull up transistors 890, 891, 892, and 893 connected in two parallel legs of two transistors each, and four pull-down transistors 894, 895, 896, and 897, also connected in two parallel legs of two transistors each. Referring to the pull-up transistors, transistor 890 has a source receiving the monitored supply voltage VDD, a gate connected to the output of inverter 864, and a drain. Transistor 892 has a source connected to the drain of transistor 890, a gate connected to the output of inverter 862, and a drain connected to the output of inverter 864. Transistor 891 has a source receiving the monitored supply voltage VDD, a gate connected to the output of inverter 862, and a drain. Transistor 893 has a source connected to the drain of transistor 892, a gate connected to the output of inverter 862, and a drain connected to the output of inverter 864. Referring to the pull-down transistors, transistor 894 has a drain connected to the output of inverter 864, a gate connected to the output of inverter 862, and a source. Transistor 896 has a drain connected to the source of transistor 894, a gate connected to the output of inverter 862, and a source connected to negative supply rail VSS for supply voltage VDD. Similarly, transistor 895 has a drain connected to the output of inverter 864, a gate connected to the output of inverter 862, and a source. Transistor 897 has a drain connected to the source of transistor 895, a gate connected to the output of inverter 862, and a source connected to negative supply rail VSS for supply voltage VDD.

In this embodiment, only the first two inverters in the series, inverters 862 and 864, have multiple devices for aging protection, and the last two inverters 866 and 868 use are constructed normally. Inverter 866 includes an input connected to the output of inverter 864, an output, a pull-up transistor 898 and a pull-down transistor 899. Pull-up transistor 898 has a source receiving the monitored supply voltage VDD, a gate connected to the input of inverter 866, and a drain connected to the output of inverter 866. Pull-down transistor 899 has a drain connected to the output of inverter 866, a gate connected to the input of inverter 866, and a source connected to a negative supply rail VSS for supply voltage VDD. Inverter 868 has a similar construction (not shown), with an input connected to the output of inverter 866 and an output connected to the comparator output terminal to provide the signal Droopdetected. Output inverter 870 is also constructed normally.

In operation, as described with respect to FIG. 6, at least inverters 862 and 864 are configured to operate in the crowbar mode or region with a high inverter gain causing a fast response for the comparator 800 when the analog voltage IN is close to one-half the voltage of supply voltage VDD. Because the analog voltage IN is held at a controlled reference level, the inverter acts to compare VDD to a designated value. The inrush current that would cause excessive aging degradation for inverters 862 and 864 is split among the two legs of pull-up transistors and pull-down transistors. The voltage drop across the inverter transistors is also spread across the two series transistors in each pull-up and pull-down leg, allowing the use of ultra-low voltage threshold (ULVT) transistors with 5 nm and smaller technology, which in the original circuit design suffer from aging effects when the host processor is in continuous use.

The series of CMOS digital inverters of FIG. 6 are employed as a quasi-analog or quasi-digital circuit in which a digital circuit performs an analog function (comparison in this case). Because the series of inverters is biased in crowbar mode (mid-rail), DC current flowing through the transistors causes large power dissipation which leads to large temperature increase in certain scenarios. The Hot Carrier Injection effect is frequently severe due to high Vds in inverter devices, high duration, and high temperature. Negative-bias temperature instability (NBTI) also occurs at high voltages relative to the transistor's specified operating voltage, causing variation in threshold voltage required to detect a certain VDDCORE value. The implementation of FIG. 8 mitigates these problems.

For example, comparator 800 of FIG. 8 is able to perform under stress conditions which cause aging and NBTI for unmodified designs. Comparator 800 is believed to be able to operate without significant variation over long-period— e.g., a continuous 3-year period, with a 1.4V VDDCORE, and a test temperature of 100 C. These conditions are employed with the crowbar bias scheme causing the comparator to frequently toggle, and accurately represent extreme workload conditions for a server processor running over such a long period. While a conventional comparator exhibits a trip threshold degradation (shift) of 80 mV under such conditions, whereas comparator 800 exhibits only a 3.2 mV threshold degradation under same conditions. Comparator 800 also has the advantage that it is able to be used in different circuit modules with different VDD values, and thus provides a stable trip point and a linear performance over a range of monitored VDD values. A disadvantage of comparator 800 is that is operates slightly slower than comparator 661 of FIG. 6 when comparator 661 is implemented with inverters including only two transistors.

While in the depicted implementation two inverters are constructed with the anti-aging features described herein, in other embodiments only the first inverter 862 may include such construction, and in still other embodiments more of the inverters may include such construction.

Figure 9:
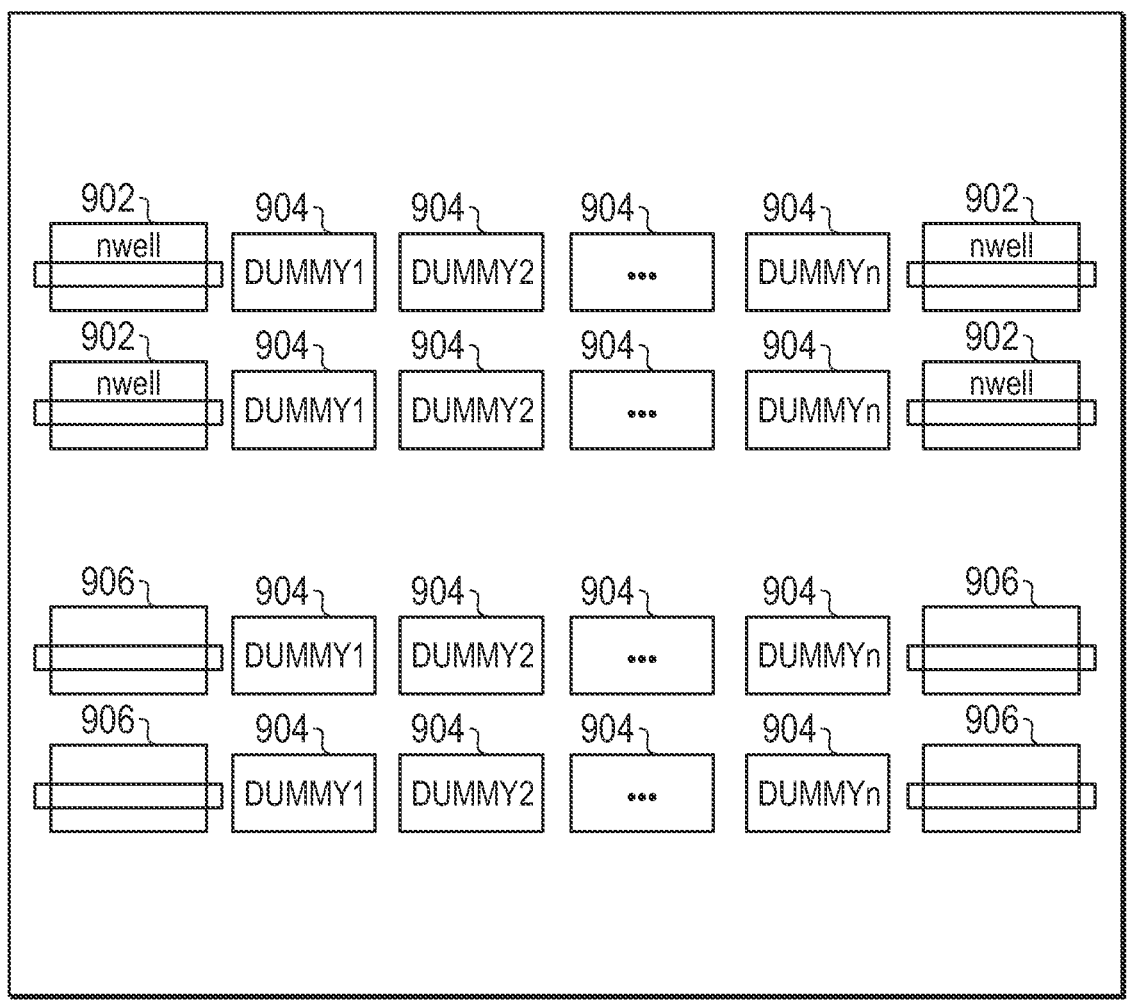
FIG. 9 shows a diagram depicting a physical circuit layout of transistors for an inverter like the initial inverters in FIG. 8.

FIG. 9 shows a diagram depicting a physical circuit layout 900 of transistors for an inverter like the initial inverters in FIG. 8. The depicted layout represents an example of improvements suitable for implementing the inverter-based comparator of FIG. 8 and other similar quasi-analog comparators with technology nodes of 5 nm and smaller.

Circuit layout 900 includes four pull-up transistors 902 and four pull-down transistors 906. The left-hand depicted transistors represent one pull-up leg and one pull-down leg of an inverter, while the right-hand transistors represent another such pair of pull-up and pull-down legs. Located between the legs are dummy regions 904. Multiple dummy regions 904 are constructed between the inverter legs with separate wells such as the depicted "nwell" regions to isolate the transistors and mitigate heating effects. As shown by the labels "DUMMY1", "DUMMY1", to "DUMMYn" for dummy regions on both the NMOS and PMOS sides of the inverter, preferably a plurality of dummy regions 904 are used. The transistors in adjacent legs (such as transistors 881 and 882 in FIG. 8) do not use shared gates in this embodiment. While the layouts are depicted with a gate region across the doped regions, the depicted techniques are suitable for use with various transistor designs such as fin field-effect transistors (FinFETs) and other transistor implementations employed with 5 nm and smaller technology nodes.

Figure 10:
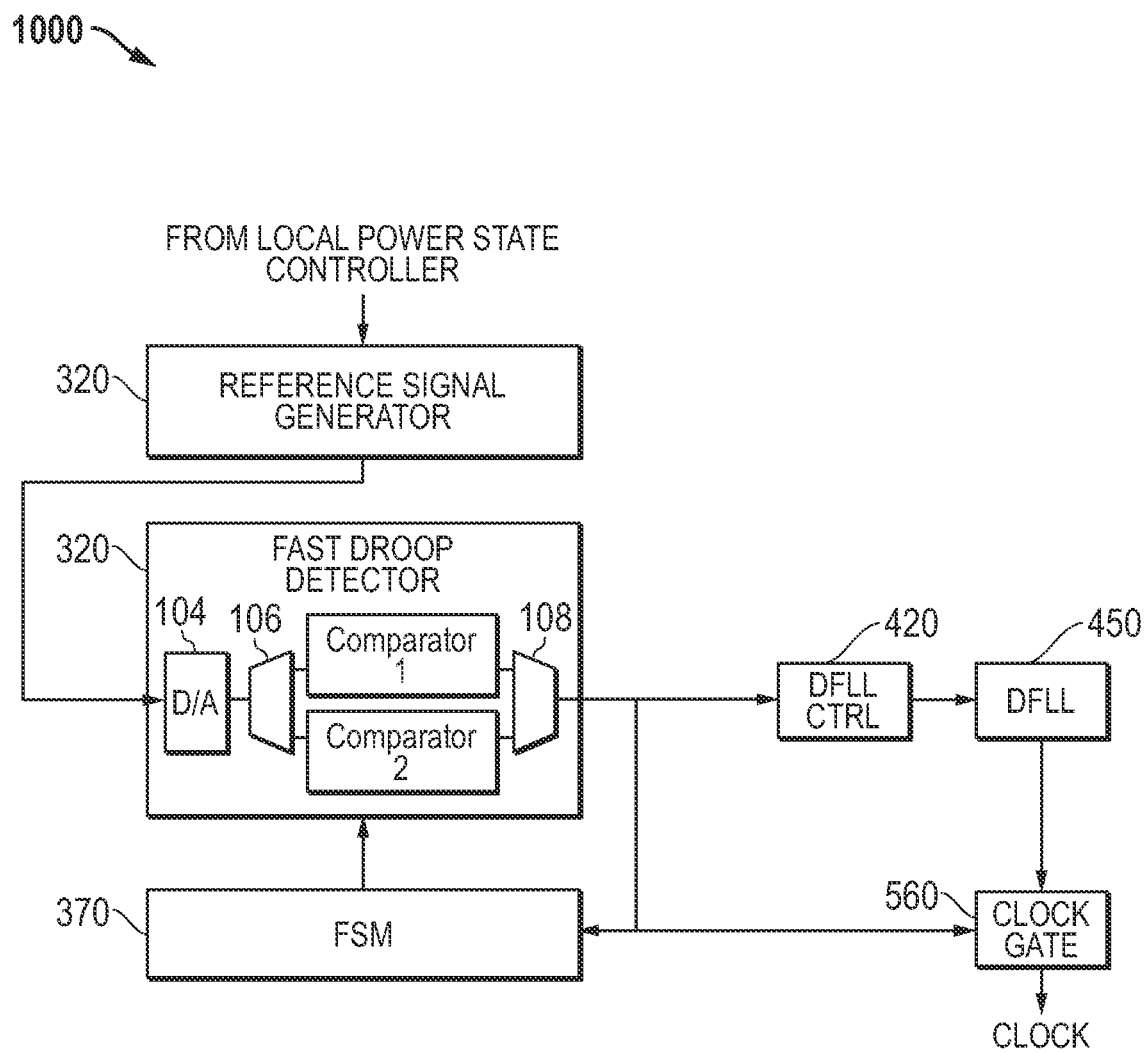
FIG. 10 illustrates a block diagram of a power supply monitor according to some additional embodiments.

FIG. 10 illustrates a block diagram of a power supply monitor 1000 according to some additional embodiments. Power supply monitor 1000 generally includes the elements of power supply monitor 500, but uses a different implementation for fast droop detector 340. Fast droop detector 340 in this implementation includes a D/A converter 106, a demultiplexer 106, two comparators labelled "Comparator 1" and "Comparator 2", and a multiplexer 108.

D/A converter 104 has an input receiving the reference signal from reference signal generator 320, for example a pulse-density modulated signal as described above, and an output. Demultiplexer 106 has an input connected to the output of D/A converter 104, a control input (not shown) and two outputs connected to each of Comparator 1 and Comparator 2, respectively. Demultiplexer 106 is an analog selector switch operable to route the output of D/A converter 104 to one of the comparators based on the control input.

Comparator 1 is preferably constructed like comparator 661 of FIG. 6, while Comparator 2 is preferably constructed like comparator 800 of FIG. 8. Each comparator includes an enable input (not shown) to selectively enable the comparator to which the analog signal is fed. Each comparator has an output connected to a respective input of multiplexer 108. Multiplexer 108 is a digital selector switch including two inputs and one output, and a control input (not shown). Multiplexer 108 connects one of its inputs to its output based on the control input. The output of multiplexer 108 is connected to DFLL control circuit 420 and to FSM 370, which function as described with respect to FIG. 5.

In operation, comparator 340 provides flexibility by allowing the relatively faster Comparator 1 to be used for applications in which speed is important, while the relatively slower but more aging and temperature resistant Comparator 2 can be active for applications such as servers that are in continuous use (including restarts) for long periods such as months or years, and have a high workload. Preferably the control inputs to demultiplexer 106, Comparator 1, Comparator 2, and multiplexer 108 are configurable through firmware. Furthermore, the use of comparator 340 in a fast droop detection circuit such as those discussed above allows the same intellectual property (IP) core to be employed in different locations in a system where one location may benefit from the performance of Comparator 1, while another may benefit from the performance of Comparator 2.

Figure 11:
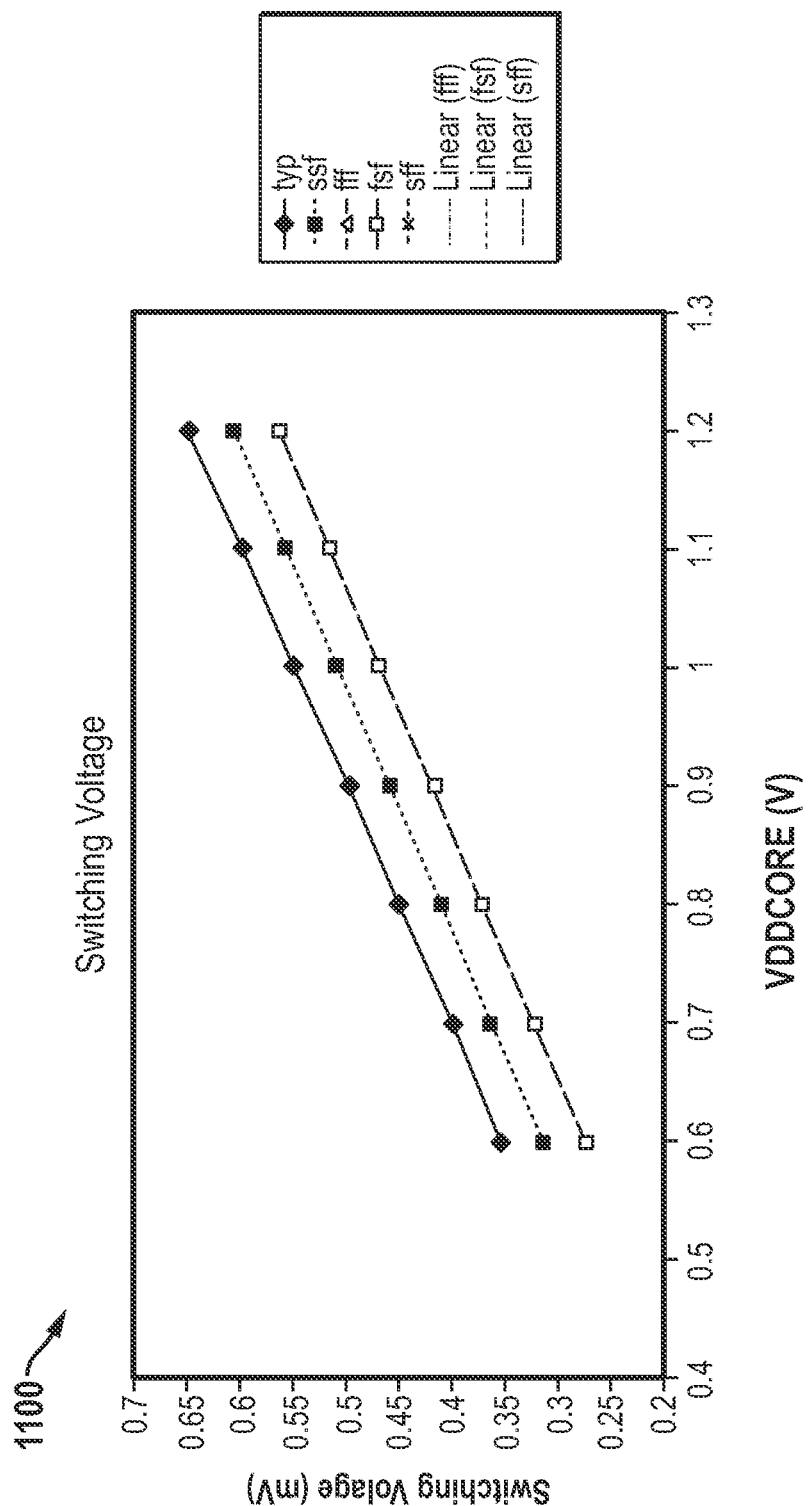
FIG. 11 shows a graph depicting switching voltage for an implementation of the power supply monitor circuit of FIG. 6.

FIG. 11 shows a graph 1100 depicting switching voltage for an implementation of the power supply monitor circuit of FIG. 6. The chart shows the switching voltage in millivolts on the vertical axis with the monitored supply voltage VDDCORE along the horizontal axis. Plots are shown for various process corner conditions as shown on the legend. As can be seen, the response of comparator 661 is very linear, enabling a 2-point calibration procedure to account for process variations.

Figure 12:
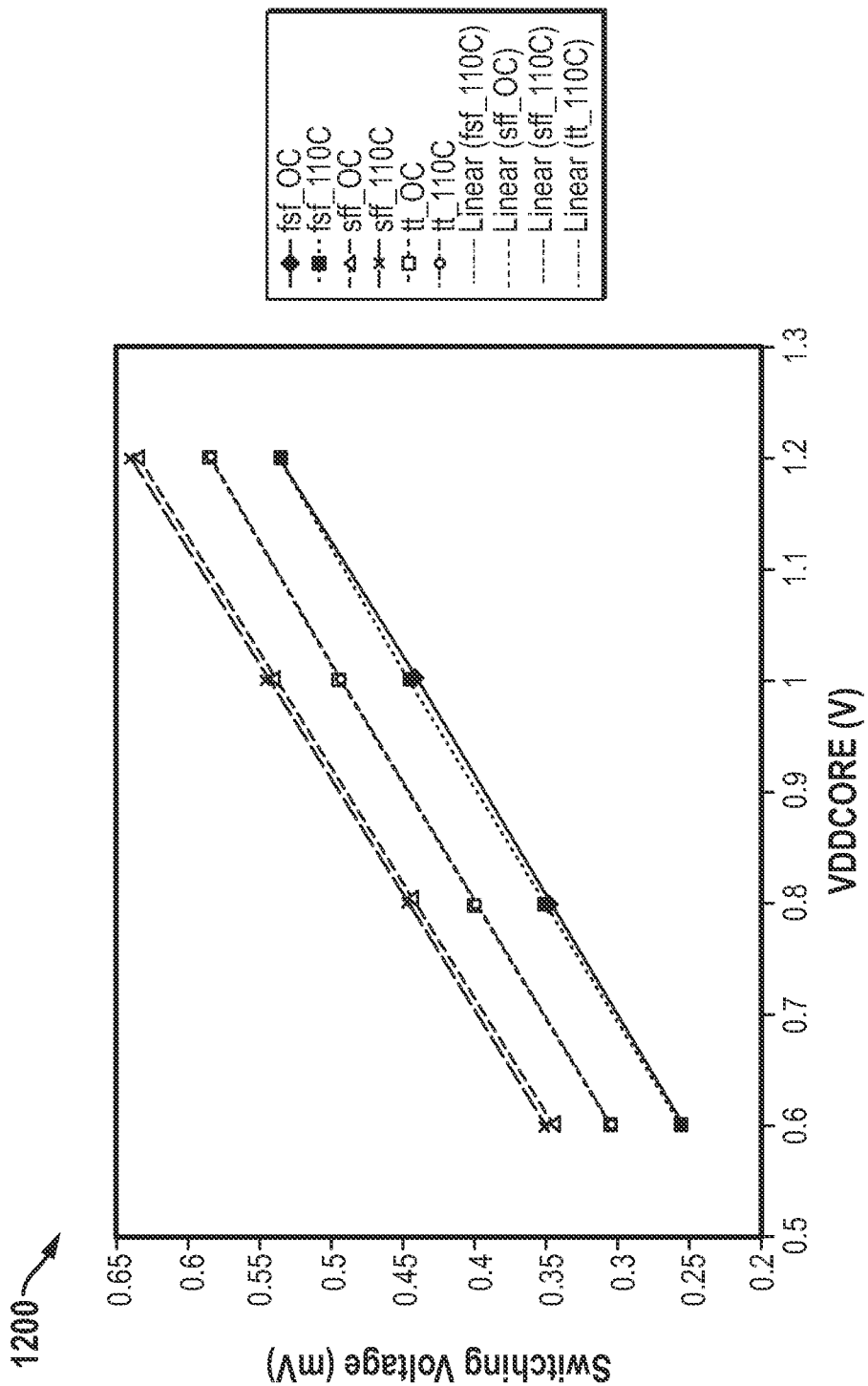
FIG. 12 shows a graph depicting switching voltage at different temperatures for an implementation of the power supply monitor circuit of FIG. 6.

FIG. 12 shows a graph 1200 depicting switching voltage at different temperatures for an implementation of the power supply monitor circuit of FIG. 6. The performance also shows very little temperature variability (8 mV maximum at the high end), which allows a single temperature calibration to be used. Dynamic characterization has also been carried out to measure detection delays, which are defined as the time lapse from when VDDCORE crosses the ideal threshold to when droopDetected is asserted. The delay characterization depends heavily on the voltage slope. This characterization was carried out at (VDD−0.55V)/10 ns, which approximately corresponds to the maximum expected voltage slope for a Zen processor core. The characterization showed the comparator circuit has the advantage of consistent performance across temperature.

Figure 13:
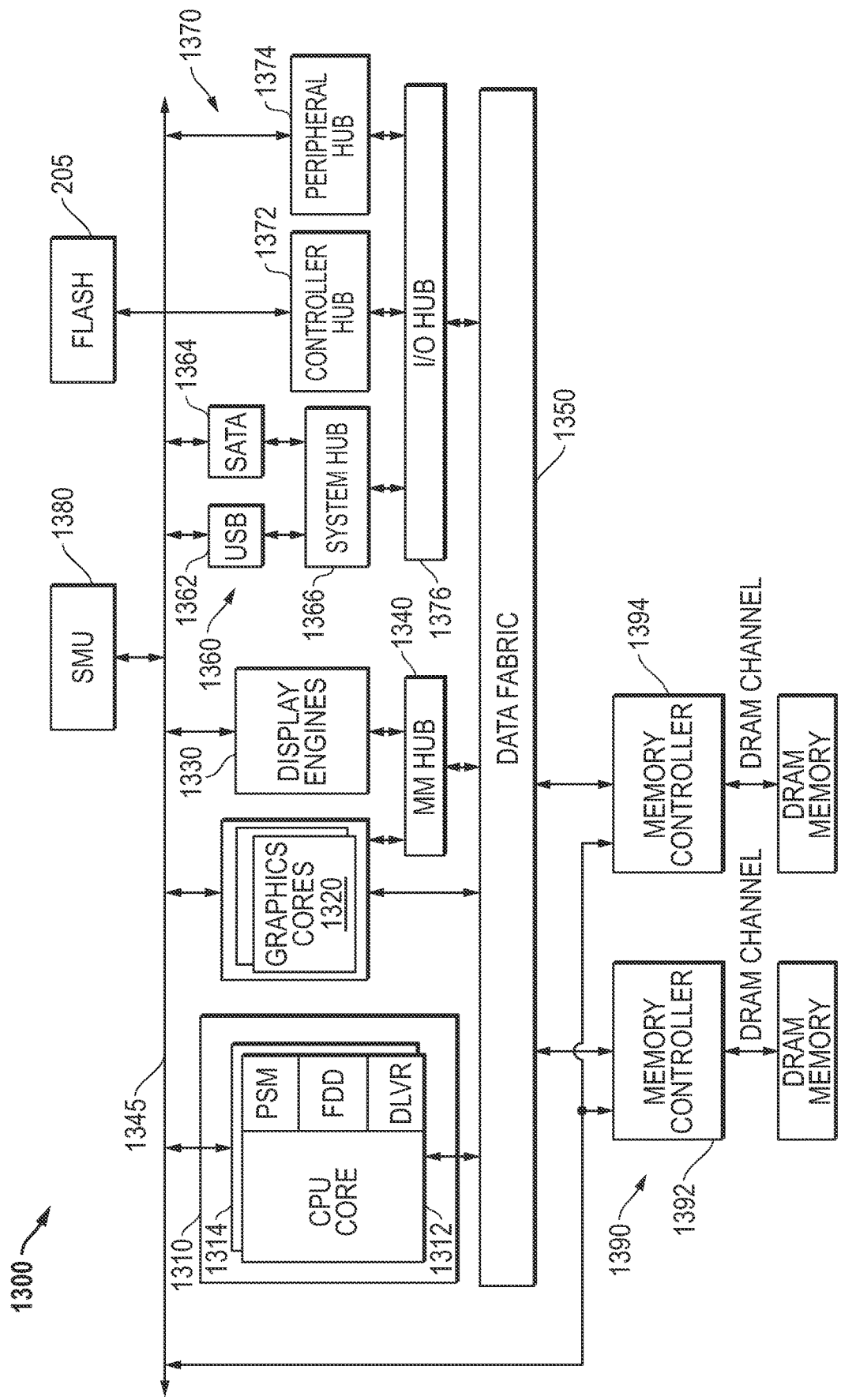
FIG. 13 illustrates in block diagram form an accelerated processing unit (APU) according to some embodiments.

FIG. 13 illustrates in block diagram form an accelerated processing unit (APU) 1300 according to some embodiments. APU 1300 is implemented as a System-on-Chip (SoC) which may be part of a variety of host data processing platforms. While an APU is shown in this embodiment, other data processing platforms such as a central processing unit (CPU) or a graphics processing unit (GPU) may be used. For example, in some embodiments, the fine-grained memory access techniques herein are embodied in a GPU chip employed in a graphics card or other graphics processing module. In other embodiments, specialized processor cores such as intelligence processing units (IPUs) may be employed. In this embodiment, APU 1300 includes generally a CPU core complex 1310, a graphics core 1320, a set of display engines 1330, a memory management hub 1340, a data fabric 1350, a set of peripheral controllers 1360, a set of peripheral bus controllers 1370, a system management unit (SMU) 1380, a flash memory 205, and a set of memory controllers 1390 including at least two memory controllers 1392 and 1394 for interfacing with respective DRAM memory.

CPU core complex 1310 includes a processor tile 1312 and a processor tile 1314, each processor tile including a CPU core, a power supply monitor (PSM), a fast droop detector (FDD), and a digital low voltage regulator (DLVR). In this example, CPU core complex 1310 includes two processor tiles, but in other embodiments processor tile complex 1310 can include an arbitrary number of processor tiles. Each of processor tiles 1312 and 1314 is bidirectionally connected to a system management network (SMN) 1345, which forms a control fabric, and to data fabric 1350, and is capable of providing memory access requests to data fabric 1350. Each of processor tiles 1312 and 1314 may be unitary cores, or may further be a core complex with two or more unitary cores sharing certain resources such as caches. The FDD implementations of FIGS. 3-6 and 8-10 are all suitable for use in processor tiles 1312 and 1314 in various embodiments. Each FDD controls a local PLL or DFLL for its local CPU core according to the techniques described above.

Each of graphics cores 1320 is a high-performance graphics processing unit (GPU) capable of performing graphics operations such as vertex processing, fragment processing, shading, texture blending, and the like in a highly integrated and parallel fashion. Power supply monitoring with an FDD such as those of FIGS. 3-6 and 8-10 may also be implemented in each of graphics cores 1320 in various embodiments. Each graphics core 1320 is bidirectionally connected to the SMN 1345 and to data fabric 1350, and is capable of providing memory access requests to data fabric 1350. In this regard, APU 1300 may either support a unified memory architecture in which CPU core complex 1310 and graphics cores 1320 share the same memory space, or a memory architecture in which CPU core complex 1310 and graphics cores 1320 share a portion of the memory space, while graphics cores 1320 also uses a private graphics memory not accessible by CPU core complex 1310.

Display engines 1330 render and rasterize objects generated by graphics core 1320 for display on a monitor. Graphics core 1320 and display engines 1330 are bidirectionally connected to a common memory management hub 1340 for uniform translation into appropriate addresses in memory, and memory management hub 1340 is bidirectionally connected to data fabric 1350 for generating such memory accesses and receiving read data returned from the memory system.

Data fabric 1350 includes a crossbar switch for routing memory access requests and memory responses between any memory accessing agent and memory controllers 1390. It also includes a system memory map, defined by basic input/output system (BIOS), for determining destinations of memory accesses based on the system configuration, as well as buffers for each virtual connection.

Peripheral controllers 1360 include a USB controller 1362 and a serial advanced technology attachment (SATA) interface controller 1364, each of which is bidirectionally connected to a system hub 1366 and to SMN 1345. These two controllers are merely exemplary of peripheral controllers that may be used in APU 1300.

Peripheral bus controllers 1370 include a system controller hub 1372 and a peripheral controller hub 1374, each of which is bidirectionally connected to an input/output (I/O) hub 1376 and to SMN 1345. System controller hub 1372 connects to Flash memory 205 over a suitable communications link. I/O hub 1376 is also bidirectionally connected to system hub 1366 and to data fabric 1350. Thus, for example, a CPU core can program registers in USB controller 1362, SATA interface controller 1364, system controller hub 1372, or peripheral controller hub 1374 through accesses that data fabric 1350 routes through I/O hub 1376.

SMU 1380 is a local controller that controls the operation of the resources on APU 1300 and synchronizes communication among them. SMU 1380 manages power-up sequencing of the various processors on APU 1300 and controls multiple off-chip devices via reset, enable and other signals. SMU 1380 also manages power for the various processors and other functional blocks.

While a SoC implementation is shown, this is not limiting, and other computing platforms may also benefit from the techniques set forth herein.

The circuits of FIG. 3, FIG. 4, FIG. 5, and FIG. 6, FIG. 8, FIG. 10, or FIG. 13, or any portions thereof, such as fast droop detector circuit 650, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. A processor comprising:
a droop detection circuit that receives a digital signal and converts the digital signal to an analog signal, compares the analog signal to a monitored supply voltage, and responsive to detecting a droop below a designated value relative to the analog signal, produces a droop detection signal,
the droop detection circuit including a first comparator circuit with a series of inverters including at least a first complimentary-metal-oxide-semiconductor (CMOS) inverter with an input for receiving the analog signal and a second CMOS inverter, each inverter comprising a positive supply terminal for receiving the monitored voltage supply, each inverter configured to operate in a crowbar mode when the monitored voltage supply is near a designated level, each inverter comprising four pull-up transistors connected in two parallel legs of two transistors, and four pull-down transistors connected in two parallel legs of two transistors.

2. The processor of claim 1, further comprising:
a second comparator circuit with a series of inverters including at least a first CMOS inverter with an input for receiving the analog signal and a second CMOS inverter, each inverter comprising a positive supply terminal for receiving the monitored supply voltage, each inverter configured to operate in a crowbar mode when the monitored supply voltage is near a designated level, each inverter further comprising a single pull-up transistor and a single pull-down transistor,
a demultiplexer coupled to the first and second comparator circuits and operable to connect the analog signal to a selected one of them.

3. The processor of claim 1, wherein the four pull-up transistors and the four pull-down transistors are each constructed without shared gates.

4. The processor of claim 1, wherein the four pull-up transistors and the four pull-down transistors are each constructed in separate wells.

5. The processor of claim 1, wherein the four pull-up transistors are constructed with at least two dummy regions separating them and the four pull-down transistors are constructed with at least two dummy regions separating them.

6. The processor of claim 1, wherein the droop detection circuit is capable of operating substantially continuously over a period of over 3 years at a temperature of 100 C and exhibiting a trip threshold degradation of approximately 3.2 millivolts.

7. The processor of claim 1, wherein the processor comprises one of a central processing unit (CPU), a graphics processing unit (GPU), and a accelerated processing unit (APU).

8. The processor of claim 7, further comprising a state machine having an input receiving the droop detection signal, and an output coupled to control a latch, wherein the state machine controls the latch to hold the droop detection signal for a designated period of time following the droop detection circuit no longer detecting a droop, and reset the droop detection signal following the designated period of time.

9. The processor of claim 1, wherein digital signal is a pulse-density modulated signal.

10. A data processing system, comprising:
at least one local power supply monitor including a droop detection circuit that converts a pulse-density modulated signal to an analog signal, compares it to a respective monitored local supply voltage, and responsive to detecting a droop below a designated value relative to the analog signal, produces a droop detection signal, the droop detection circuit including a first comparator circuit with a series of inverters including at least a first complimentary-metal-oxide-semiconductor (CMOS) inverter with an input for receiving the analog signal and a second CMOS inverter, each with a positive supply terminal for receiving the respective monitored local voltage supply, each configured to operate in a crowbar mode when the respective monitored local voltage supply is near a designated level, each comprising four pull-up transistors connected in two parallel legs of two transistors, and four pull-down transistors connected in two parallel legs of two transistors.

11. The data processing system of claim 10, wherein the at least one local power supply monitor includes a reference signal generator that receives a digital value and produces the pulse-density modulated signal based on the digital value.

12. The data processing system of claim 10, wherein the at least one local power supply monitor is embodied in an integrated circuit including at least two processor tiles each comprising digital logic, a local clock providing a clock signal for synchronizing the digital logic, and a respective local power supply monitor for monitoring a respective monitored local supply voltage.

13. The data processing system of claim 10, wherein the at least one local power supply monitor further comprises:
   a second comparator circuit with a series of inverters including at least a first CMOS inverter with an input for receiving the analog signal and a second CMOS inverter, each with a positive supply terminal for receiving the respective monitored local supply voltage, each configured to operate in a crowbar mode when the respective monitored local supply voltage is near a designated level, each comprising a single pull-up transistor and a single pull-down transistor; and
   a demultiplexer coupled to the first and second comparator circuits and operable to connect the analog signal to a selected one of them and provide the droop detection signal from the selected one.

14. The data processing system of claim 10, wherein the four pull-up transistors and the four pull-down transistors are each constructed without shared gates.

15. The data processing system of claim 10, wherein the four pull-up transistors and the four pull-down transistors are each constructed in separate wells.

16. The data processing system of claim 10, wherein the at least one local power supply monitor further comprises:
   a digital frequency-locked loop (DFLL) providing a clock signal for synchronizing circuitry within a domain of the respective monitored local supply voltage; and
   a DFLL control circuit that, responsive to receiving the droop detection signal, causes the DFLL to slow the clock signal.

17. The data processing system of claim 16, wherein the at least one local power supply monitor further comprises:
   a clock gate coupled to the DFLL for gating the clock signal; and
   a latch with an input receiving the droop detection signal and an output coupled to the clock gate for gating the clock signal responsive to the droop detection signal.

18. The data processing system of claim 17, wherein at least one of the local power supply monitor further comprises a state machine having an input receiving the droop detection signal, and an output coupled to control the latch, wherein the state machine controls the latch to hold the droop detection signal for a designated period of time following the droop detection circuit no longer detecting a droop, and reset the droop detection signal following the designated period of time.

19. The data processing system of claim 17, wherein the DFLL control circuit is further operable to set a DFLL increment amount at the DFLL for controlling how quickly the DFLL increases a speed of the clock signal after the clock signal is slowed.

20. The data processing system of claim 17, wherein the droop detection circuit includes a level shifter for converting the pulse-density modulated signal to be referenced to a clean supply voltage.

21. A method of monitoring a power supply, the method comprising:
   receiving a binary number;
   creating a pulse-density modulated digital signal referenced to a first supply voltage and scaled based on the binary number;
   lowpass filtering the pulse-density modulated digital signal to create an analog signal; and
   with a series of inverters, detecting a droop in a monitored supply voltage by comparing the analog signal to a portion of the monitored supply voltage by supplying the monitored supply voltage to respective power supply terminals of the inverters and feeding the analog signal to a first inverter of said series of inverters; and
   splitting inverter activation current for at least the first inverter between two parallel legs of two series pull-up transistors and splitting inverter deactivation current for at least the first inverters between two parallel legs of two series pull-down transistors.

22. The method of claim 21, further comprising altering a target value of the monitored supply voltage, and altering the binary number to provide a new value associated with the altered target value of the monitored supply voltage.

* * * * *